(12) United States Patent
Yang et al.

(10) Patent No.: US 8,477,006 B2
(45) Date of Patent: Jul. 2, 2013

(54) RESISTOR AND MANUFACTURING METHOD THEREOF

(75) Inventors: Jie-Ning Yang, Ping-Tung County (TW); Shih-Chieh Hsu, New Taipei (TW); Chun-Hsien Lin, Tainan (TW); Yao-Chang Wang, Tainan (TW); Chi-Horn Pai, Tainan (TW); Chi-Sheng Tseng, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 29 days.

(21) Appl. No.: 13/220,721

(22) Filed: Aug. 30, 2011

(65) Prior Publication Data

US 2013/0049924 A1 Feb. 28, 2013

(51) Int. Cl.
*H01C 1/012* (2006.01)

(52) U.S. Cl.
USPC ............ 338/314; 257/258; 257/350; 438/592

(58) Field of Classification Search
USPC ........................................................ 338/314
See application file for complete search history.

(56) References Cited

U.S. PATENT DOCUMENTS

| | | | |
|---|---|---|---|
| 5,998,873 A | 12/1999 | Blair | |
| 6,033,963 A | 3/2000 | Huang | |
| 6,043,138 A | 3/2000 | Ibok | |
| 6,372,605 B1 | 4/2002 | Kuehne | |
| 6,406,956 B1 | 6/2002 | Tsai | |
| 6,509,232 B1 | 1/2003 | Kim | |
| 6,653,698 B2 * | 11/2003 | Lee et al. | 257/407 |
| 6,670,275 B2 | 12/2003 | Lee | |
| 6,784,472 B2 * | 8/2004 | Iriyama et al. | 257/288 |
| 6,855,607 B2 | 2/2005 | Achuthan | |
| 6,858,483 B2 | 2/2005 | Doczy | |
| 6,921,711 B2 | 7/2005 | Cabral, Jr. | |
| 6,953,719 B2 | 10/2005 | Doczy | |
| 6,967,131 B2 | 11/2005 | Saenger | |
| 6,972,225 B2 | 12/2005 | Doczy | |
| 7,013,446 B2 | 3/2006 | Ohba | |
| 7,029,966 B2 | 4/2006 | Amos | |
| 7,030,430 B2 | 4/2006 | Doczy | |
| 7,056,794 B2 | 6/2006 | Ku | |
| 7,064,050 B2 | 6/2006 | Cabral, Jr. | |
| 7,064,066 B1 | 6/2006 | Metz | |
| 7,074,680 B2 | 7/2006 | Doczy | |
| 7,084,025 B2 | 8/2006 | Phua | |
| 7,112,495 B2 | 9/2006 | Ko | |
| 7,112,851 B2 | 9/2006 | Saenger | |
| 7,126,199 B2 | 10/2006 | Doczy | |
| 7,148,548 B2 | 12/2006 | Doczy | |
| 7,153,734 B2 | 12/2006 | Brask | |
| 7,153,755 B2 | 12/2006 | Liu | |
| 7,157,378 B2 | 1/2007 | Brask | |
| 7,183,184 B2 | 2/2007 | Doczy | |

(Continued)

*Primary Examiner* — Kyung Lee
(74) *Attorney, Agent, or Firm* — Winston Hsu; Scott Margo

(57) ABSTRACT

A manufacturing method for a resistor integrated with a transistor having metal gate includes providing a substrate having a transistor region and a resistor region defined thereon, respectively forming a transistor having a dummy gate in the transistor region and a resistor in the resistor region, removing the dummy gate and portions of the resistor to form a first trench in the transistor and two second trenches in the resistor, forming at least a high-k gate dielectric layer in the first trench and the second trenches, and forming a metal gate in the first trench and metal structures respectively in the second trenches.

15 Claims, 8 Drawing Sheets

U.S. PATENT DOCUMENTS

| | | |
|---|---|---|
| 7,208,366 B2 | 4/2007 | Tsai |
| 7,214,620 B2 | 5/2007 | Kim |
| 7,220,635 B2 | 5/2007 | Brask |
| 7,250,658 B2 | 7/2007 | Doris |
| 7,316,949 B2 | 1/2008 | Doczy |
| 7,317,231 B2 | 1/2008 | Metz |
| 7,326,610 B2 | 2/2008 | Amos |
| 7,355,281 B2 | 4/2008 | Brask |
| 7,384,880 B2 | 6/2008 | Brask |
| 7,390,709 B2 * | 6/2008 | Doczy et al. ............ 438/199 |
| 7,521,324 B2 | 4/2009 | Ohmi |
| 7,531,437 B2 | 5/2009 | Brask |
| 7,592,270 B2 | 9/2009 | Teo |
| 7,601,648 B2 | 10/2009 | Chua |
| 7,824,990 B2 | 11/2010 | Chang |
| 8,193,641 B2 * | 6/2012 | Rachmady et al. ...... 257/758 |
| 2005/0202624 A1 | 9/2005 | Li |
| 2007/0015365 A1 | 1/2007 | Chen |
| 2007/0072376 A1 | 3/2007 | Chen |
| 2007/0218661 A1 | 9/2007 | Shroff |
| 2007/0262451 A1 * | 11/2007 | Rachmady et al. ...... 257/758 |
| 2008/0061366 A1 | 3/2008 | Liu |
| 2009/0039433 A1 | 2/2009 | Yang |
| 2009/0057759 A1 | 3/2009 | Obradovic |
| 2009/0057769 A1 * | 3/2009 | Wei et al. ............... 257/369 |
| 2009/0124097 A1 | 5/2009 | Cheng |
| 2009/0186458 A1 | 7/2009 | Yu |
| 2009/0200494 A1 | 8/2009 | Hatem |
| 2009/0289284 A1 | 11/2009 | Goh |
| 2010/0040768 A1 | 2/2010 | Dhindsa |
| 2010/0044783 A1 | 2/2010 | Chuang |
| 2010/0048027 A1 | 2/2010 | Cheng |
| 2010/0052066 A1 | 3/2010 | Yu |
| 2010/0065926 A1 | 3/2010 | Yeh |
| 2010/0068877 A1 * | 3/2010 | Yeh et al. ............... 438/592 |
| 2010/0075507 A1 | 3/2010 | Chang |
| 2010/0129994 A1 | 5/2010 | Awad |
| 2010/0184281 A1 | 7/2010 | Hsu |
| 2010/0328022 A1 | 12/2010 | Fan et al. |

* cited by examiner

RESISTOR AND MANUFACTURING METHOD THEREOF

BACKGROUND OF THE INVENTION

1. Field of the Invention

The invention relates to a resistor and a manufacturing method thereof, and more particularly, to a resistor and a manufacturing method for a resistor integrated with a transistor having metal gate.

2. Description of the Prior Art

To increase the performance of transistors, metal gates are popularly used in the semiconductor field: the metal gates competent to the high dielectric constant (hereinafter abbreviated as high-K) gate dielectric layer replace the traditional polysilicon gates to be the control electrode. The metal gate approach can be categorized to the gate first process and the gate last process. And the gate last process gradually replaces the gate first process because it provides more material choices for the high-k gate dielectric layer and the metal gate.

Additionally, resistors are elements which are often used for providing regulated voltage and for filtering noise in a circuit. The resistors generally include polysilicon and silicide layers.

In the current semiconductor field, though the fabricating processes are improved with the aim of reaching high yields, it is found that integration of the manufacturing methods of those different kinds of semiconductor devices are very complicated and difficult. Therefore, a method for fabricating a resistor integrated with a transistor having metal gate is still in needed.

SUMMARY OF THE INVENTION

According to an aspect of the present invention, a manufacturing method for a resistor integrated with a transistor having metal gate, is provided. The manufacturing method includes providing a substrate having a transistor region and a resistor region defined thereon, forming a transistor having a dummy gate in the transistor region and a resistor in the resistor region, removing the dummy gate and portions of the resistor to form a first trench in the transistor and two second trenches in the resistor, forming at least a high-k gate dielectric layer in the first trench and the second trenches, and forming a metal gate in the first trench and metal structures respectively in the second trenches.

According to another aspect of the present invention, a resistor is provided. The resistor includes a substrate, a polysilicon portion positioned on the substrate, and two metal portions respectively positioned on two opposite ends of the polysilicon portion. The metal portions respectively comprise a U-shaped high-k gate dielectric layer in bottoms.

According to the manufacturing method for a resistor integrated with a transistor having metal gate provided by the present invention, the resistor and the transistor having the metal gate are integrated without increasing process complexity. Furthermore, since the resistor includes the metal portions, the materials contacted to the contacts are simplified and thus the material choice of the contacts is increased and the process window is improved. More important, since the resistor includes the metal portions which possess superior thermal stability, the stability and the performance of the resistor are both consequently improved.

These and other objectives of the present invention will no doubt become obvious to those of ordinary skill in the art after reading the following detailed description of the preferred embodiment that is illustrated in the various Figures and drawings.

BRIEF DESCRIPTION OF THE DRAWINGS

FIGS. 1-8 are schematic drawings illustrating a manufacturing method for a resistor integrated with a transistor having metal gate provided by a preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

DETAILED DESCRIPTION

Figure 1:
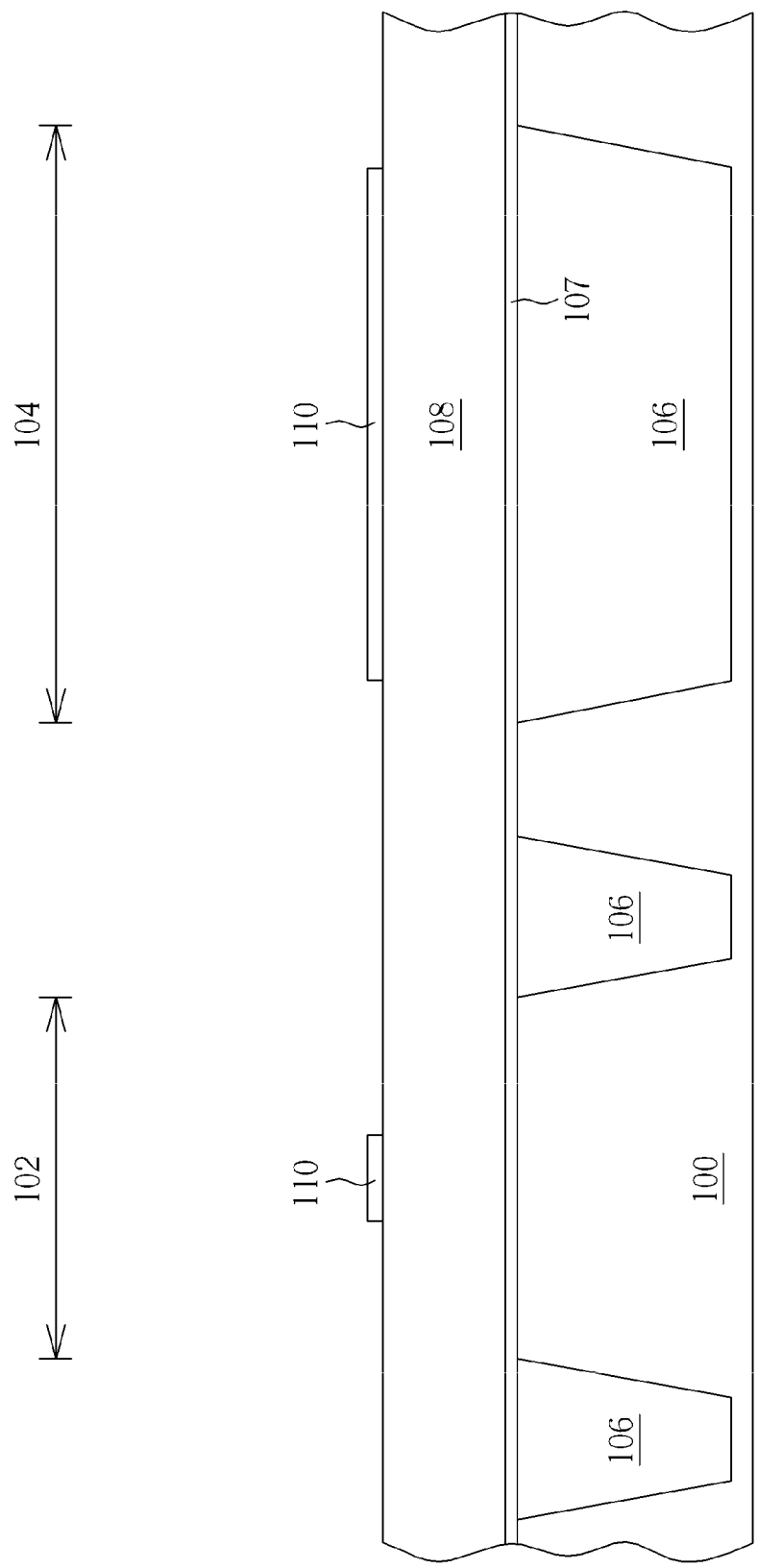

Please refer to FIGS. 1-8, which are schematic drawings illustrating a manufacturing method for a resistor integrated with a transistor having metal gate provided by a preferred embodiment of the present invention. As shown in FIG. 1, a substrate 100 having a transistor region 102 and a resistor region 104 defined thereon is provided. The substrate 100 also includes a plurality of shallow trench isolations (STIs) 106 positioned in between devices for providing electrical isolation. It is noteworthy that a STI 106 is formed in the resistor region 104. Then, a dielectric layer 107, a polysilicon layer 108, and a patterned hard mask 110 are sequentially formed on the substrate 100. The patterned hard mask 110 is formed to define a gate for a transistor and a resistor. It is noteworthy that the dielectric layer 107 formed between the substrate 100 and the polysilicon layer 108 can include conventional dielectric material such as silicon oxide.

Figure 2:
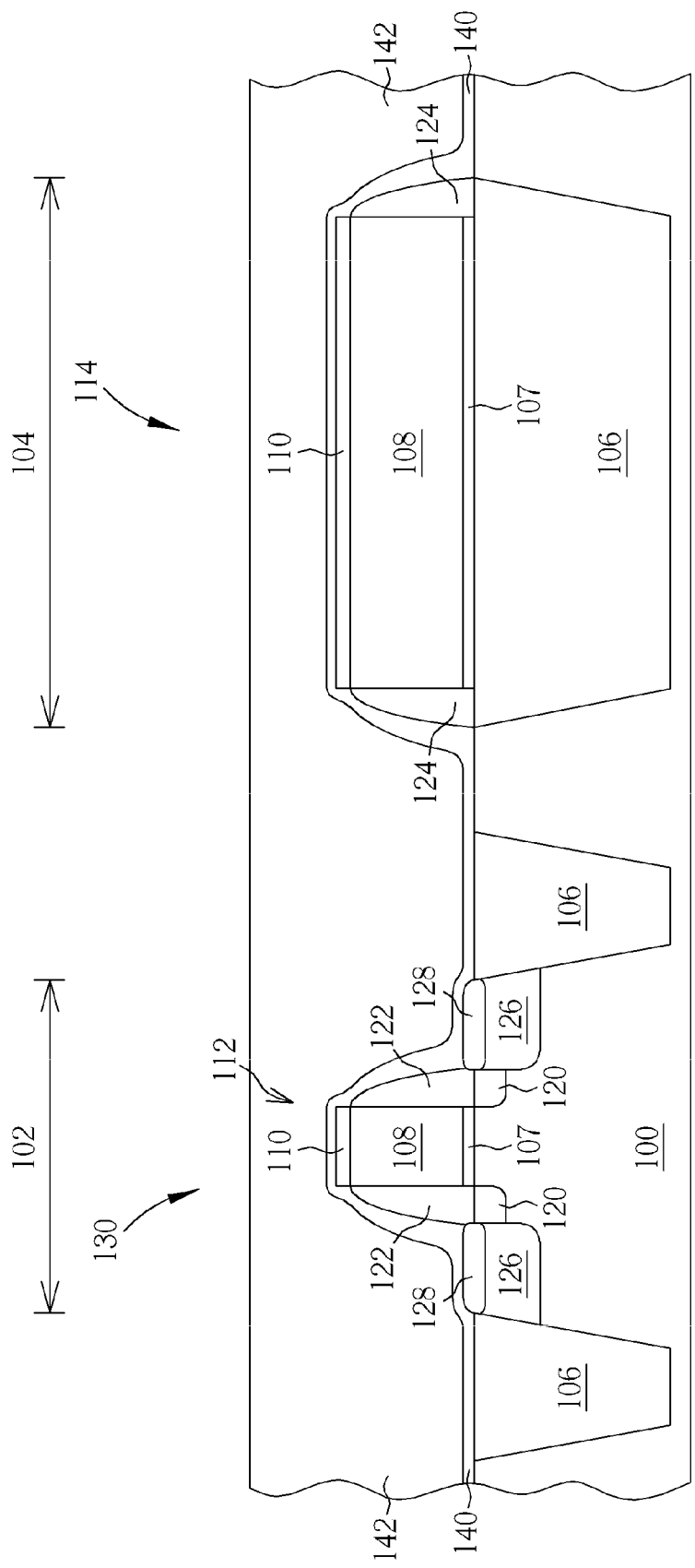

Please refer to FIG. 2. Next, an etching process is performed to etch the polysilicon layer 108 and the dielectric layer 107 with the patterned hard mask 110 serving as an etching mask. Consequently, a dummy gate 112 is formed in the transistor region 102 and a resistor 114 is formed in the resistor region 104 simultaneously. Thereafter, lightly-doped drains (LDDs) 120 are formed in the substrate 100 respectively at two sides of the dummy gate 112. After forming the LDDs 120, a spacer 122 is formed on sidewalls of the dummy gate 112 and a spacer 124 is formed on sidewalls of the resistor 114. Subsequently, a source/drain 126 is formed in the substrate 100 respectively at two sides of the dummy gate 112, particularly at two sides of the spacer 122. Accordingly, a transistor 130 having the dummy gate 112 is obtained. Furthermore, a salicide 128 can be formed on surface of the source/drain 126 of the transistor 130. After forming the transistor 130 and the resistor 114, a contact etch stop layer (CESL) 140 and an inter-layer dielectric (ILD) layer 142 are sequentially formed to cover the transistor 130 and the resistor 114. Since the steps and material choices for the above-mentioned elements are well-known to those skilled in the art, those details are omitted herein in the interest of brevity. Furthermore, selective strain scheme (SSS) can be used in the preferred embodiment. For example, a selective epitaxial growth (SEG) method can be used to form the source/drain 126.

Figure 3:
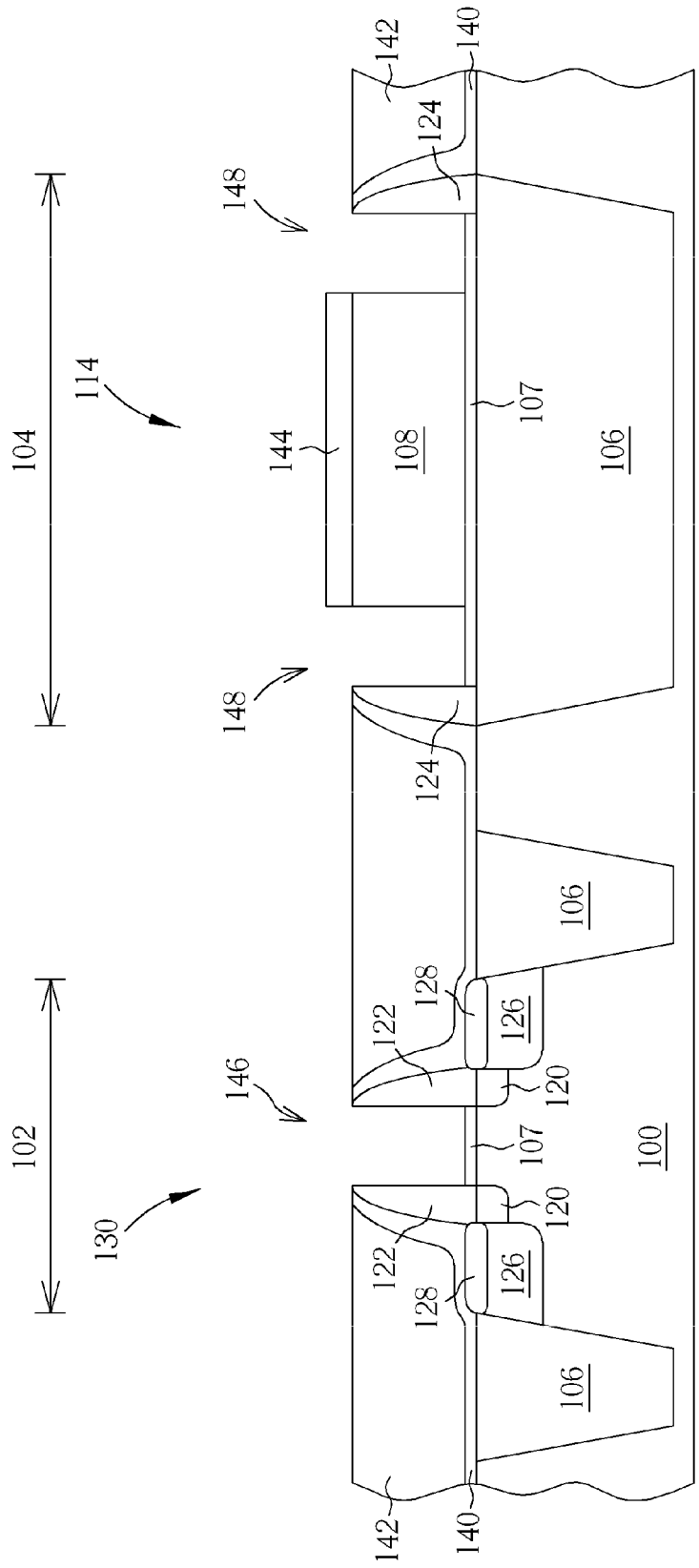

Please refer to FIG. 3. After forming the CESL 140 and the ILD layer 142, a planarization process is performed to remove a portion of the CESL 140, a portion of the ILD layer 142, and a portion of the patterned hard mask 110. Then an etching process, such as a dry etching process, is performed to remove the remnant patterned hard mask 110 and to expose the dummy gate 112 of the transistor 130 and the resistor 114. Then, a patterned hard mask 144 is formed on the substrate 100. The patterned hard mask 144 covers a portion of the resistor 114 and exposes two opposite ends of the resistor 114. Subsequently, a proper etching process is performed to remove the dummy gate 112 and portions of the resistor 114 not covered by the patterned hard mask 144. Thus a first trench 146 is formed in the transistor 130 and two the second trenches 148 are simultaneously formed in the two opposite ends of the resistor 114. It is noteworthy that because the preferred embodiment is integrated with the gate last process and the high-k last process, the dielectric layer 107 renders protection to the underneath substrate 100 during removing the dummy gate 112 of the transistor 130 and the portions of the resistor 114. The dielectric layer 107 therefore is exposed in the first trench 146 and the second trenches 148 after removing the dummy gate 112 and the portions of the resistor 114.

Figure 4:
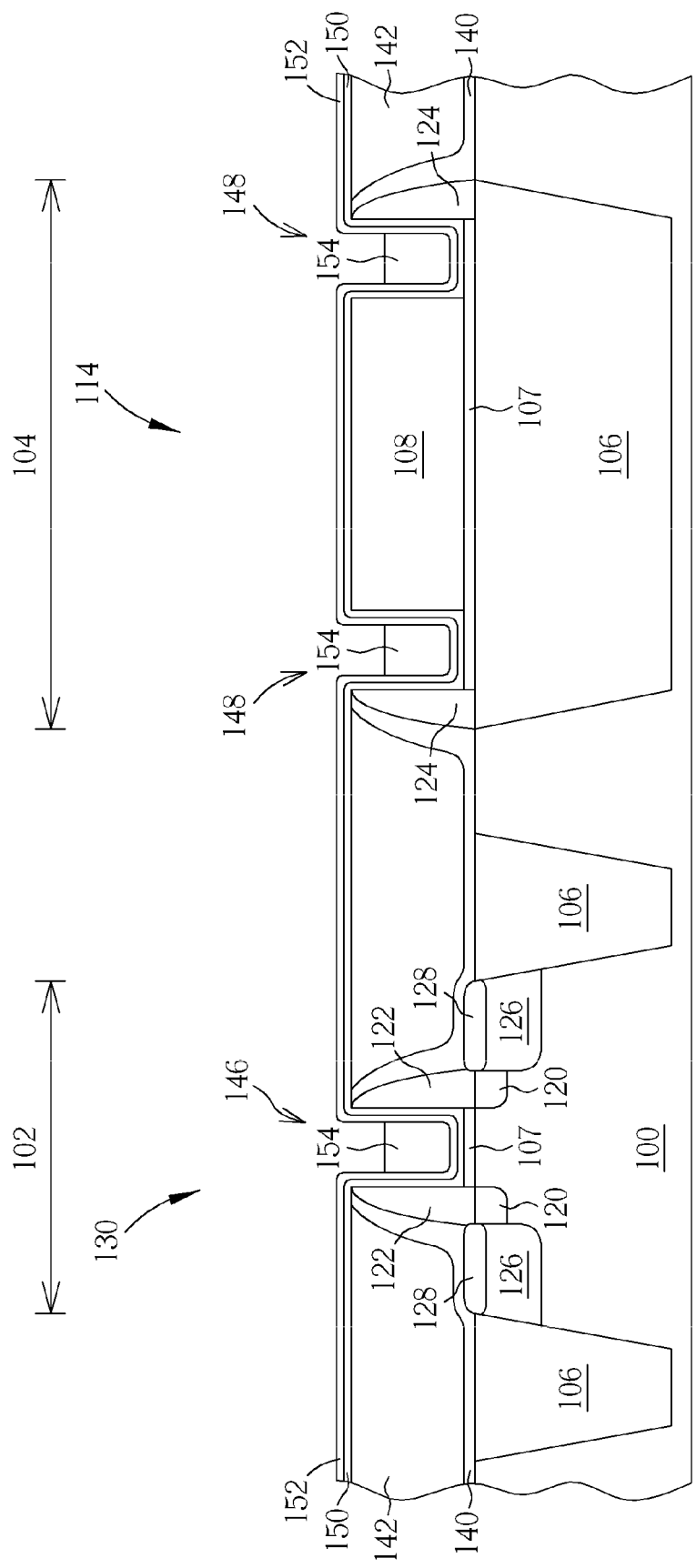

Please refer to FIG. 4. After forming the first trench 146 and the second trenches 148, the dielectric layer 107 exposed in the first trench and the second trenches 148 serves as an interfacial layer. Then the patterned hard mask 144 is removed and followed by sequentially forming a high-k gate dielectric layer 150 and a bottom barrier layer (not shown) on the substrate 100. The high-k gate dielectric layer 150 can be a metal oxide layer such as rare earth metal oxide. For example, the high-k gate dielectric layer 150 includes material selected from the group consisting of as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST). The bottom barrier layer can include titanium nitride (TiN), but not limited to this. In addition, an etch stop layer (not shown) can be formed on the bottom barrier layer. The etch stop layer can include tantalum nitride (TaN), but not limited to this.

Please refer to FIG. 4 again. Next, a chemical vapor deposition (CVD) or a physical vapor deposition (PVD) is performed to form a work function metal layer 152 in the first trench 146 and the second trenches 148. According to the preferred embodiment, the work function metal layer 152 can include suitable materials providing an appropriate work function for p-type transistor or n-type transistor. Therefore, the work function metal layer 152 has a work function, and the work function can be between 4.8 eV and 5.2 eV, or alternatively between 3.9 eV and 4.3 eV. Furthermore, the work function metal layer 152 can be a single-layered structure or a multilayered structure.

Please still refer to FIG. 4. Next, a blocking layer 154 is formed on the substrate 100. The blocking layer 154 can include photoresist, but not limited to this. The blocking layer 154 is formed in the first trench 146 and the second trenches 148. More important, a height of the blocking layer 154 is lower than a depth of the first trench 146 and of the second trenches 148. In other words, a surface of the blocking layer 154 is lower than an opening of the first trench 146 and of the second trenches 148.

Figure 5:
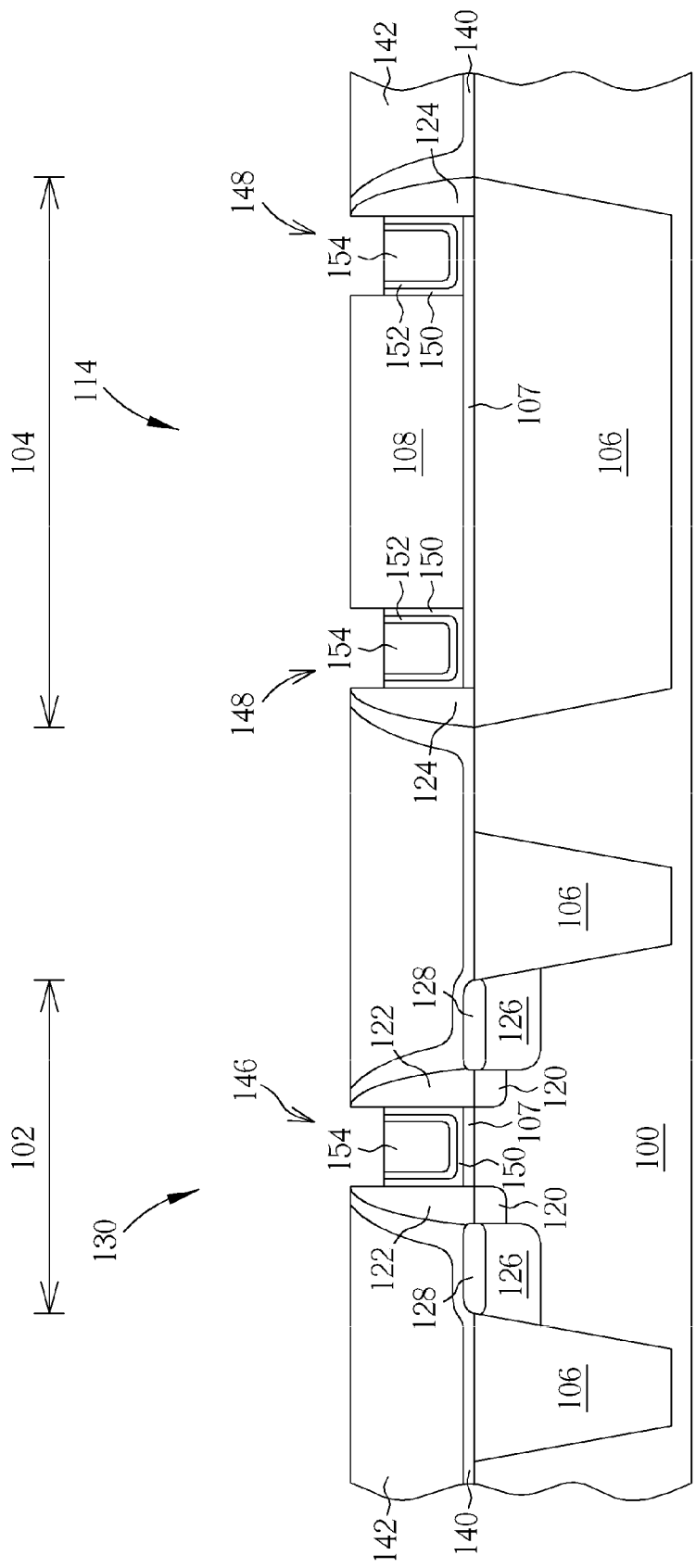

Please refer to FIG. 5. Thereafter, an etching process is performed to remove the work function metal layer 152 and the high-k gate dielectric layer 150 not covered by the blocking layer 154 with any proper etchant. As shown in FIG. 5, the high-k gate dielectric layer 150 and the work function metal layer 152 respectively include a U shape after the etching process. And topmost portions of the U-shaped high-k gate dielectric layer 150 and of the U-shaped work function metal layer 152 are all lower than the openings of the first trench 146 and the second trenches. In other words, the high-k gate dielectric layer 150 and the work function metal layer 152 are remained only in the first trench 146 and the second trenches 148, particularly on the bottoms and sidewalls of the first trench 146 and of the second trenches 148. By performing the etching process, the high-k gate dielectric layer 150 is made not completely cover the sidewalls of the second trenches 148, therefore the electron transmission pathway are kept imperviously completed. Furthermore, since the overhangs composed of the high-k gate dielectric layer 150 and the work function metal layer 152 and formed on the openings of the first trench 146 are removed by the etching process, the gap-filling result of the following formed metal materials can be improved.

Figure 6:
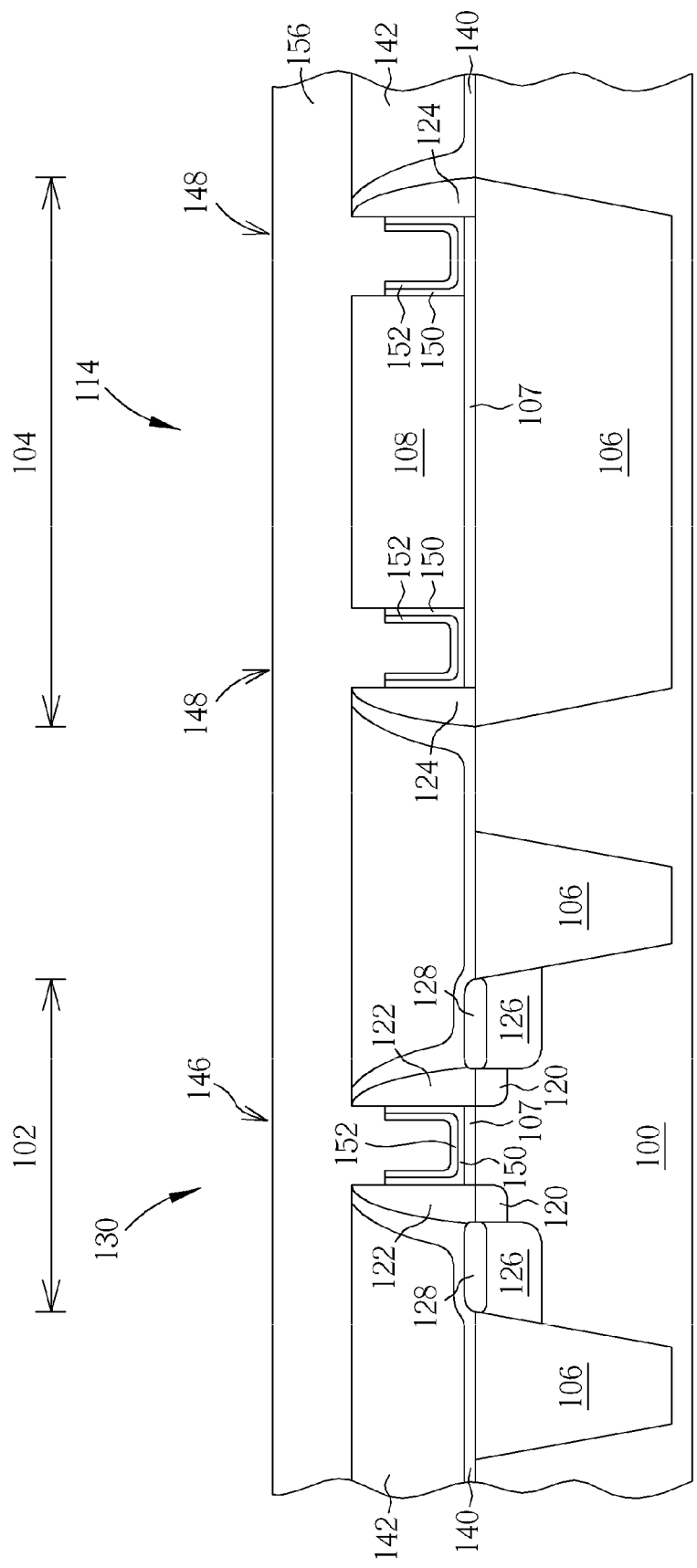

Please refer to FIG. 6. The blocking layer 154 is removed from the first trench 146 and the second trenches 148 and followed by forming a filling metal layer 156 on the work function metal layer 152 in the first trench 146 and the second trenches 148. Additionally, a top barrier layer (not shown) is preferably formed between the work function metal layer 152 and the filling metal layer 156. The top barrier layer can include TiN, but not limited to this. The filling metal layer 156 filling up the first trench 146 and the second trenches 148 includes materials with low resistance and superior gap-filling characteristic, such as aluminum (Al), titanium aluminide (TiAl) or titanium aluminum oxide (TiAlO), but not limited to this.

Figure 7:
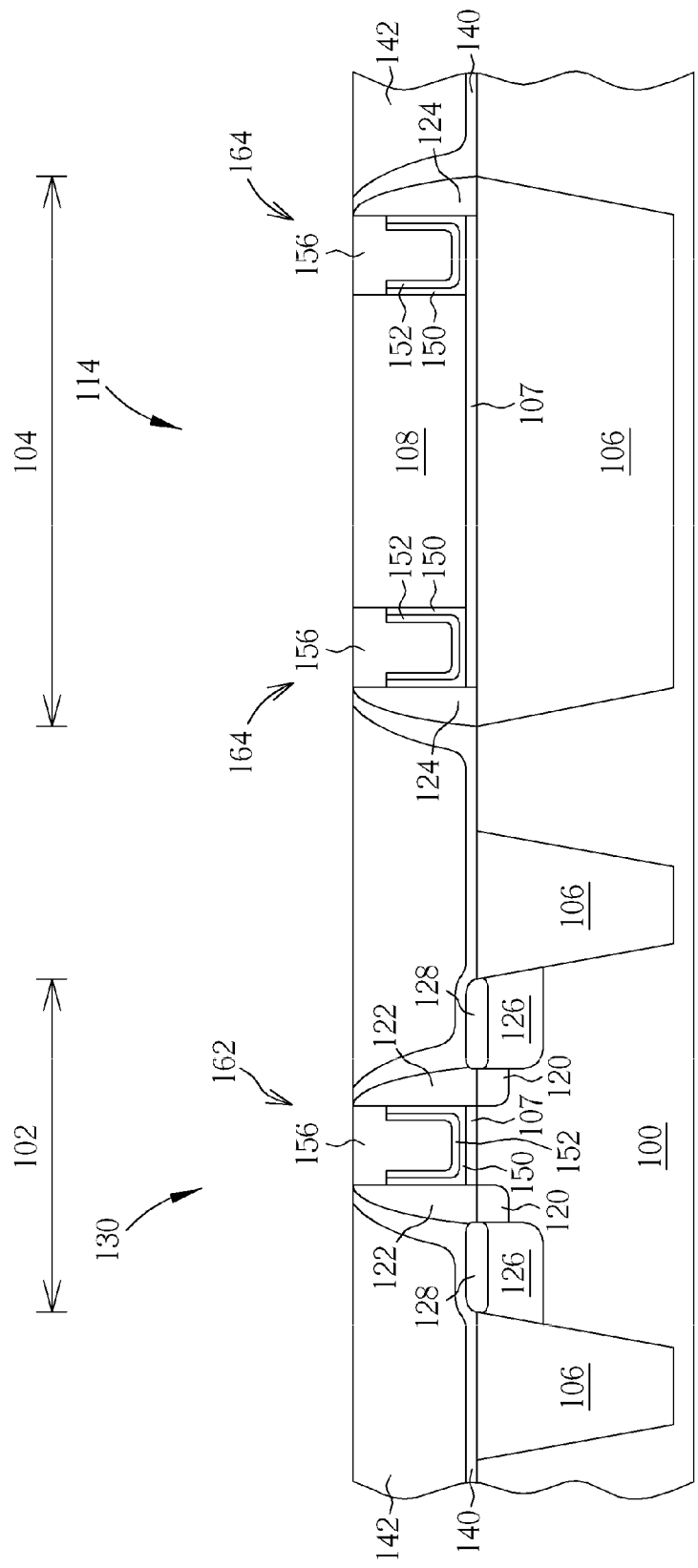

Please refer to FIG. 7. Next, a planarization process such as a CMP process is performed to remove the unnecessary filling metal layer 156. Consequently, a metal gate 162 is formed and a transistor 130 having the metal gate 162 is obtained in the transistor region 102. More important, two metal structures 164 are respectively formed in the second trenches 148 in the resistor region 104 simultaneously with forming the metal gate 162. According to the preferred embodiment, the resistor 114 in the resistor region 104 is formed to have a polysilicon portion 108 and two metal portions 164. As shown in FIG. 7, the metal portions 164 of the resistor 114 are positioned respectively at the two opposite ends of the polysilicon portion 108. The metal portions 164 respectively have a U-shaped high-k gate dielectric layer 150 and a U-shaped work function metal layer 152 in bottoms, and topmost portions of the U-shaped high-k gate dielectric layer 150 and of the U-shaped work function metal layer 152 are lower than a surface of the metal portions 164. In addition, the ILD layer 142 and the CESL 140 can be selectively removed and sequentially reformed on the substrate 100 for improving performance of the transistor 130 in the preferred embodiment.

Figure 8:
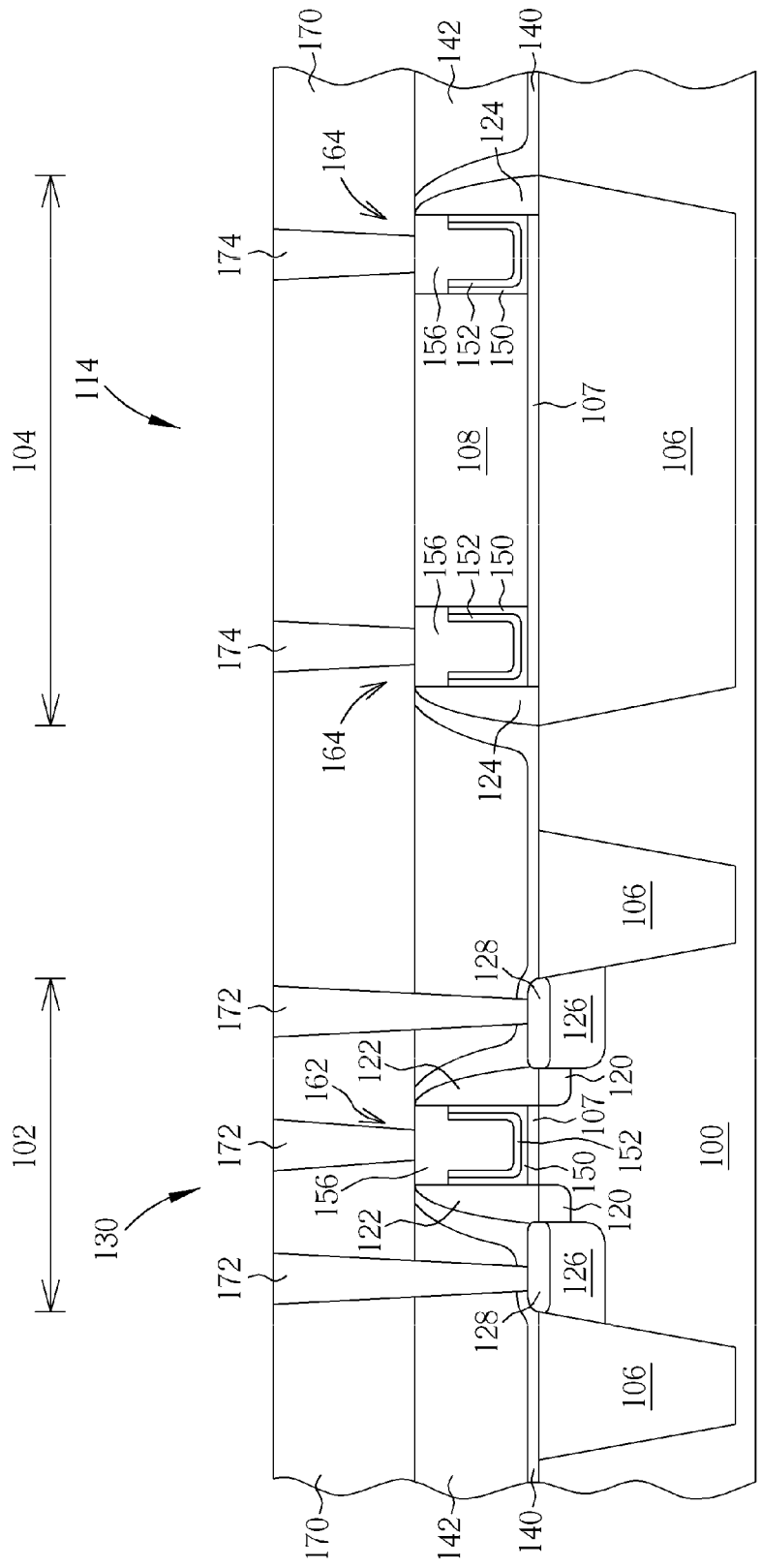

Please refer to FIG. 8. Then, a dielectric layer 170, preferably is a multilayered structure, is formed on the substrate 100. And a plurality of first contacts 172 and two second contacts 174 are formed in the dielectric layer 170. The first contacts 170 are electrically connected to the metal gate 162 and the source/drain 126 of the transistor 130, and the second contacts 174 are electrically connected to the two metal portions 164 of the resistor 114. It is noteworthy that because the contacts 172, 174 are landing on two different materials (the metal materials of the metal gate 162 and the metal portions 164, and the salicides 128), the contact process is simplified when comparing with the conventional contact process, of which the contacts are landing on three different materials (the metal material of the metal gate, the polysilicon of the resistor, and the salicide formed on the source/drain). Accordingly, the material choice for the contacts is increased and the process window is also improved. Furthermore, because the second contacts 174 contact with the metal portions 164, the surface resistance (Rs) between the second contacts 174 and the resistor 114 is decreased and the stability of the resistor 114 is improved. In the same time, the thermal stability of the resistor 114 is also improved due to the metal portions 164.

According to the manufacturing method for a resistor integrated with a transistor having metal gate, the resistor and the transistor having the metal gate are integrated without increasing process complexity. Furthermore, since the resistor includes the metal portions, the materials contacted to the contacts are simplified and thus the material choice of the contacts is increased and the process window is improved. More important, since the resistor includes the metal portions which possess superior thermal stability, the stability the performance of the resistor are consequently improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method for a resistor integrated with a transistor having metal gate, comprising:
    providing a substrate having a transistor region and a resistor region defined thereon;
    forming a transistor having a dummy gate in the transistor region and a resistor in the resistor region;
    removing the dummy gate and portions of the resistor to form a first trench in the transistor and two second trenches in the resistor;
    forming at least a high dielectric constant (high-k) gate dielectric layer in the first trench and the second trenches; and
    forming a metal gate in the first trench and metal structures respectively in the second trenches.

2. The manufacturing method for a resistor integrated with a transistor having metal gate according to claim 1, wherein the dummy gate and the resistor comprise polysilicon.

3. The manufacturing method for a resistor integrated with a transistor having metal gate according to claim 1, wherein the second trenches are formed respectively at two opposite ends of the resistor.

4. The manufacturing method for a resistor integrated with a transistor having metal gate according to claim 1, further comprising:
    forming a work function metal layer on the high-k gate dielectric layer in the first trench and the second trenches;
    forming a blocking layer in the first trench and the second trenches; and
    performing an etching process to remove the work function metal layer and the high-k gate dielectric layer not covered by the blocking layer.

5. The manufacturing method for a resistor integrated with a transistor having metal gate according to claim 4, wherein a height of the blocking layer is lower than a depth of the first trench and a depth of the second trenches.

6. The manufacturing method for a resistor integrated with a transistor having metal gate according to claim 4, wherein the high-k gate dielectric layer and the work function metal layer comprises a U shape.

7. The manufacturing method for a resistor integrated with a transistor having metal gate according to claim 6, wherein topmost portions of the high-k gate dielectric layer and the work function metal layer is lower than an opening of the second trenches.

8. The manufacturing method for a resistor integrated with a transistor having metal gate according to claim 4, further comprising forming a filling metal layer in the first trench and the second trenches after the etching process.

9. The manufacturing method for a resistor integrated with a transistor having metal gate according to claim 1, further comprising forming a first contact and two the second contacts on the substrate, the first contact is electrically connected to the metal gate and the second contacts are respectively electrically connected to the metal structures.

10. A resistor comprising:
    a substrate;
    a polysilicon portion positioned on the substrate; and
    two metal portions respectively positioned on two opposite ends of the polysilicon portion, the metal portions respectively comprising a U-shaped high-k gate dielectric layer in bottoms.

11. The resistor according to claim 10, wherein a topmost portion of the U-shaped gate dielectric layer is lower than a surface of the metal portions.

12. The resistor according to claim 10, wherein the metal portions comprise a multilayered structure.

13. The resistor according to claim 12, wherein the metal portions further comprises a work function metal layer and a filling metal layer.

14. The resistor according to claim 13, wherein the work function metal layer comprises a U-shaped work function metal layer.

15. The resistor according to claim 14, wherein a topmost portion of the U-shaped work function metal layer is lower than a surface of the metal portions.

* * * * *